US005654713A

United States Patent [19]

Mayes et al.

[11] Patent Number: 5,654,713

[45] Date of Patent: Aug. 5, 1997

[54] N-BIT ANALOG-TO-DIGITAL CONVERTER HAVING RATIOED REFERENCE VOLTAGE GENERATION USING SELF-CORRECTING CAPACITOR RATIO AND VOLTAGE COEFFICIENT ERROR

[75] Inventors: Michael K. Mayes, San Jose; Sing W. Chin, Alameda, both of Calif.

[73] Assignee: National Semiconductor Corporation, Santa Clara, Calif.

[21] Appl. No.: 348,737

[22] Filed: Dec. 2, 1994

Related U.S. Application Data

[62] Division of Ser. No. 183,678, Jan. 19, 1994, abandoned.

[51] Int. Cl.$^6$ .............................. H03M 1/12; G05F 3/16

[52] U.S. Cl. .............................. 341/156; 323/313

[58] Field of Search .............................. 323/312, 313; 341/155, 156, 161

[56] References Cited

U.S. PATENT DOCUMENTS

| | | | |
|---|---|---|---|
| 4,295,089 | 10/1981 | Cooperman | 323/313 |
| 4,999,630 | 3/1991 | Masson | 341/120 |
| 5,170,266 | 12/1992 | Kim | 341/163 |
| 5,194,867 | 3/1993 | Fisher | 341/159 |
| 5,297,066 | 3/1994 | Mayes | 364/578 |
| 5,444,447 | 8/1995 | Wingender | 341/156 |

*Primary Examiner*—Matthew V. Nguyen

*Attorney, Agent, or Firm*—Limbach & Limbach L.L.P.

[57] ABSTRACT

An n-bit analog-to-digital converter system, where n is a positive integer, includes a ratioed reference voltage generator that uses a reference voltage $V_{ref}$. The reference voltage generator includes a voltage selector having a plurality of voltage selector inputs and a plurality of voltage selector outputs for applying a first voltage to a corresponding voltage selector output during a time period $\phi_1$ and for applying a second voltage to a corresponding voltage selector output during a following time period $\phi_2$. The voltage applied to one voltage selector output during any time period is not necessarily the same as the voltage applied to another voltage selector output. The reference voltage generator further includes an amplifier having a plurality of inputs and a differential voltage output and a plurality of sets of capacitances. Each set of capacitances couples an associated one of the voltage selector outputs to an associated one of the inputs of the amplifier and has a value such that the electrical combination of the voltages and capacitances provides a voltage level of $\pm V_{ref}/m$, where m is any desired number, at the differential output of the amplifier.

14 Claims, 4 Drawing Sheets

N-BIT ANALOG-TO-DIGITAL CONVERTER HAVING RATIOED REFERENCE VOLTAGE GENERATION USING SELF-CORRECTING CAPACITOR RATIO AND VOLTAGE COEFFICIENT ERROR

This application is a Divisional of U.S. application Ser. No. 08/183,678 filed Jan. 19, 1994, now abandoned.

CROSS-REFERENCE TO RELATED APPLICATIONS

This application is related to copending U.S. patent application Ser. No. 08/183,679 filed Jan. 19, 1994 on an invention of Mayes and Chin entitled "Pipelined Analog-to-Digital Converter with Curvefit Digital Correction", which is assigned to National Semiconductor Corporation, the assignee of this invention.

INTRODUCTION

1. Technical Field

This invention pertains to electronic circuits, and more specifically to electronic circuits which are capable of generating highly accurate ratioed reference voltages.

2. Background

Integrated circuits are well known and many such integrated circuits require the use of an accurate ratio of a reference voltage. An example of a widely used ratio reference voltage circuit is a resistive or capacitive ratio divider, or level shifting obtained utilizing a diode or transistor components. But such prior art ratio reference voltage circuits are limited in their accuracy due to the problem with component matching, and, at least in the case of semiconductor components, the variations due to processing parameters and operating temperatures.

SUMMARY

A novel ratioed reference voltage circuit is taught which enables positive and negative output voltages as a ratio of a given reference voltage. The desired ratio is established by capacitor ratios. During the operation of the circuit, positive and negative ratioed output voltages are provided at various points in time which are not necessarily very accurate due to component mismatches and the like. However, the average of the positive ratioed reference voltage during two different periods of time is a highly accurate positive ratioed reference voltage due to error cancellation. Similarly, the average of the negative ratioed reference voltage during two different periods of time is a highly accurate negative ratioed reference voltage due to error cancellation

DETAILED DESCRIPTION

Figure 1A:
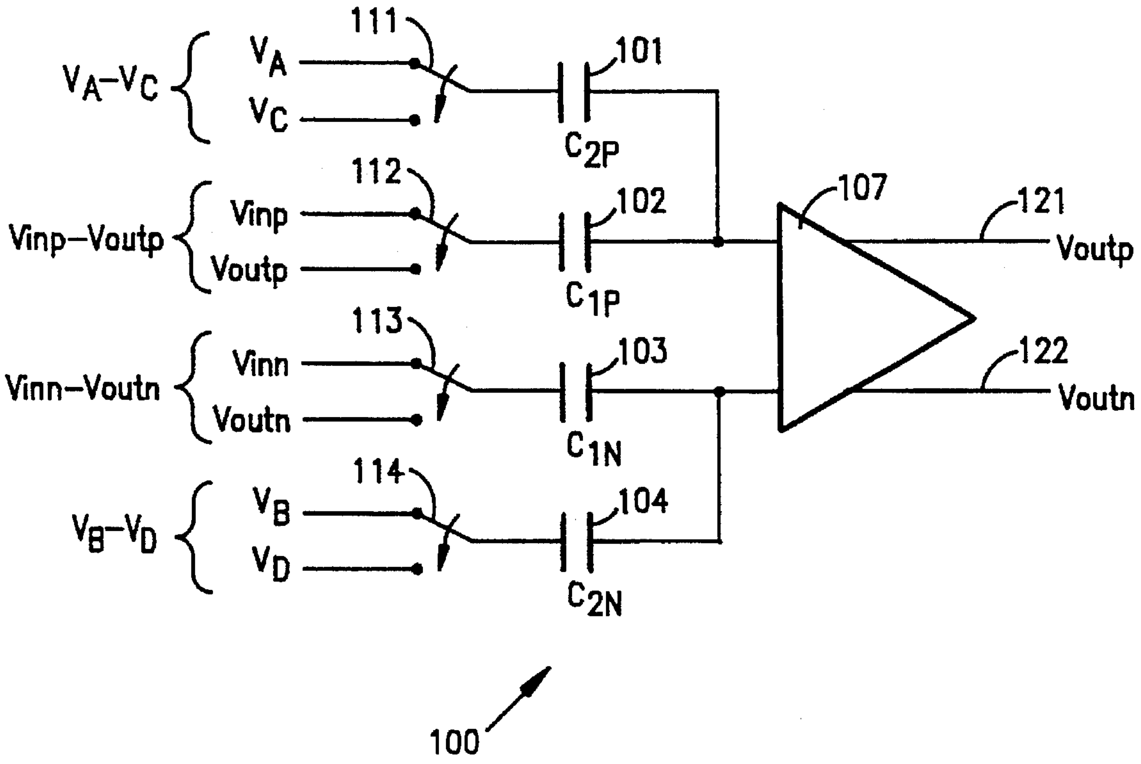
FIG. 1*a* is a diagram of a half-reference voltage generation circuit utilizing switched capacitors constructed in accordance with the teachings of this invention.

FIG. 1*a* is a schematic diagram of one embodiment of a ratioed reference voltage generation circuit 100 constructed in accordance with the teachings of this invention. Ratioed reference voltage circuit 100 of FIG. 1*a* is used in combination with a voltage selector such as an analog multiplexer which selectively applies appropriate reference voltage levels $V_A$, $V_B$, $V_C$, $V_D$, Vinp, and Vinn, to generate ratioed reference voltages Voutp and Voutn which are dependent of component ratios and voltage coefficients, and thus are not highly accurate. For purposes of the example discussed herein, it is assumed that the ratioed voltage desired is a half-reference voltage, although by appropriate selection of capacitor ratio, any desired voltage ratio can be achieved in accordance with the teachings of this invention.

Figure 1B:
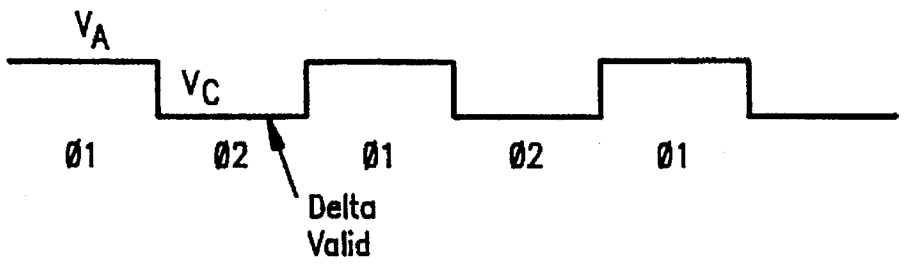
FIG. 1*b* is a timing diagram depicting a two-phase clock used to operate switches 111 through 114 of FIG. 1*a;*

FIG. 1*b* is a timing diagram depicting a control signal applied to switches 111 through 114 of circuit 100 to select the appropriate ones of the input voltages on each of those switches. For example, during a first timing phase $\phi_1$, switch 111 selects voltage $V_A$, and during a second timing period $\phi_2$, switch 111 selects voltage $V_C$. At a point after the transition from $\phi_1$ to $\phi_2$, the output voltages $V_{outp}$ and $V_{outn}$ from the half-reference circuit is valid. In operation of an analog-to-digital converter, period $\phi_2$ may correspond to a period in which an input voltage is sampled, and period $\phi_1$ may correspond to an analysis operation of a single stage of a pipelined analog-to-digital converter to provide valid digital output data.

FIG. 1*a* depicts this analog multiplexer as switches 111 through 114. Switch 111 selects input voltage $V_A$ at time $\phi_1$ and input voltage $V_C$ at time $\phi_2$ for application to one plate of capacitor 101 having a capacitance value $C_{2P}$, and whose second plate is applied to one input lead of operational amplifier 107. Similarly, switch 112 selectively applies input voltage $V_{inp}$ at time $\phi_1$ and input voltage $V_{outp}$ at time $\phi_2$ to a first plate of capacitor 102 having a capacitance value $C_{1P}$, and whose other plate is also connected to the same input lead of operational amplifier 107 as is capacitor 101. Switch 113 selectively applies input voltage $V_{inn}$ at time $\phi_1$ and input voltage $V_{outn}$ at time $\phi_2$ to a first plate of capacitor 103, having a capacitance value $C_{1N}$, and whose other plate is connected to the second input lead of operational amplifier 107. Similarly, switch 114 selectively applies input voltages $V_B$ (at time $\phi_1$) and $V_D$ (at time $\phi_2$) to a first plate of capacitor 104, having a capacitance value $C_{2N}$, whose second plate is connected to the second input lead of operational amplifier 107. Operational amplifier 107 provides on its output leads 121 and 122 output voltages $V_{outp}$ and $V_{outn}$, respectively. The voltage difference between positive half-reference output voltage Voutp and negative- half-reference output voltage Voutn is equal to ±Vref/2, in this example where Vref is the reference voltage, depending on the state of circuit 100.

Summing charge in circuit 100 and solving for output voltages Voutp and Voutn, during time period $\phi_2$, after settling, the following approximations hold true:

$$Voutp = \frac{(V_A - V_C)\cdot(1+\alpha(V_A - V_C)+\beta(V_A - V_B)^2)\cdot C_{2P}}{C_{1P}\cdot(1+\alpha(Vinp - Voutpi)+\beta(Vinp - Voutpi)^2)+\frac{1}{opampgain}} + Vinp \quad (1)$$

$$Voutn = \frac{(V_A - V_C)\cdot(1+\alpha(V_A - V_C)+\beta(V_A - V_B)^2)\cdot C_{2N}}{C_{1N}\cdot(1+\alpha(Vinn - Voutni)+\beta(Vinn - Voutni)^2)+\frac{1}{opampgain}} + Vinn \quad (2)$$

where $\alpha$=the first order voltage coefficient of capacitance values C1P, C1N, C2P, and C2N;

$\beta$=the second order voltage coefficient of capacitance values C1P, C1N, C2P, and C2N; and opampgain=the open loop gain of operational amplifier 107.

Assuming ideal conditions, i.e. $\alpha$=0, $\beta$=0, apampgain= infinity, and ideal capacitor matching such that C2P=C2N and such that C1P=C1N (with these capacitor values being selected to provide a half-reference voltage output signal as a desired ratioed output voltage), then ideal values of Voutp and Voutn are given by, respectively, $$Voutpi = vinp + \frac{1}{4}\ (V_A - V_C) \quad (3)$$

$$Voutni = vinn + \frac{1}{4}\ (V_B - V_D) \quad (4)$$

Figure 1C:
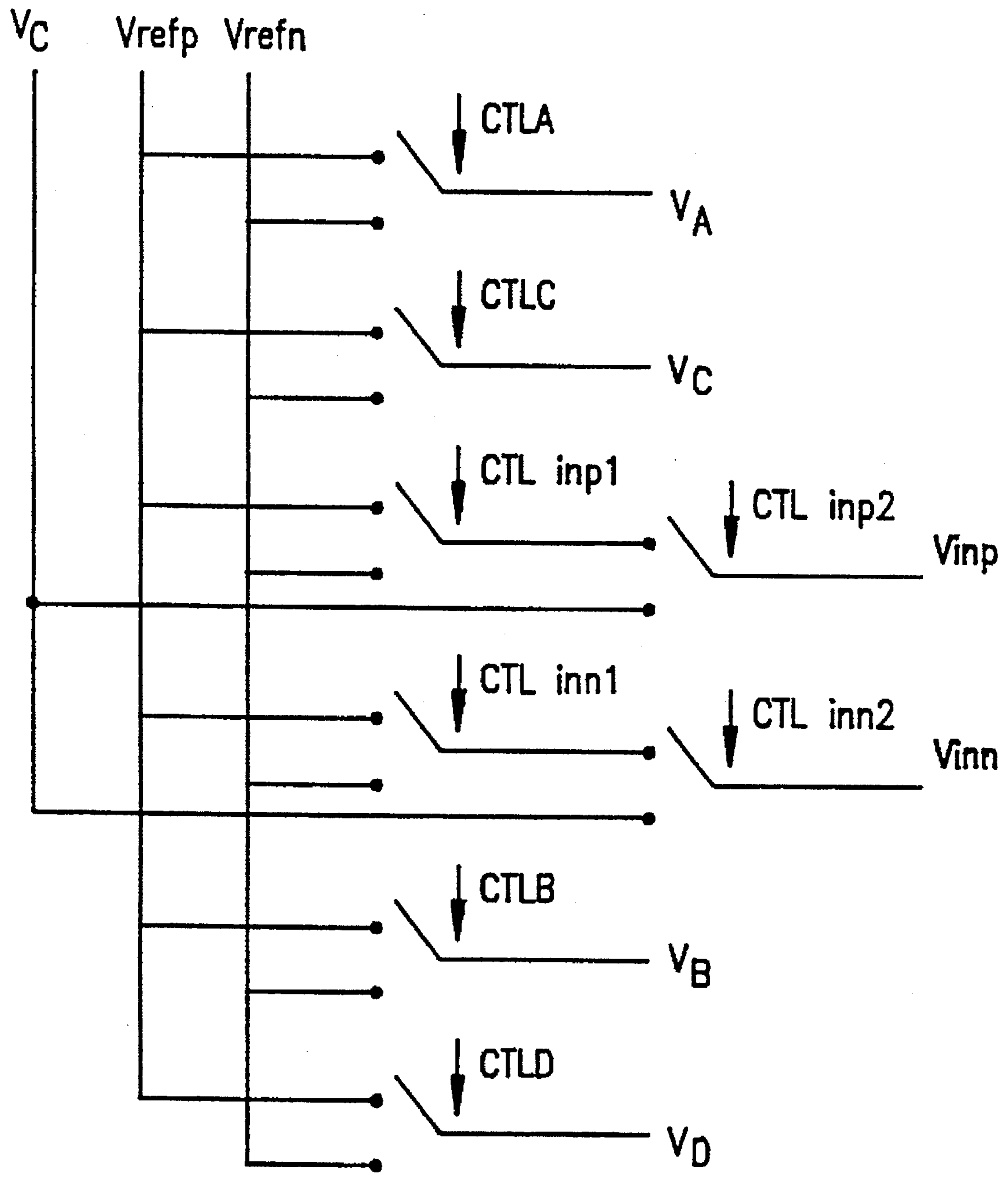
FIG. 1*c* is an example of a multiplexer circuit suitable for use in generating appropriate voltages indicated in the circuit of FIG. 1*a;*

Multiplexing various combinations of $V_A$, $V_B$, $V_C$, $V_D$, Vinp, and Vinn results in Voutp-Voutn providing values of ±Vref/2, as shown in Table 1, with a specific example shown in Table 2 for an example where Vref is 5 volts and ±Vref/2 is thus equal to ±2.5 volts. In tables 1 and 2, $V_{CM}$ is the common mode voltage of the operational amplifiers used in the analog to digital converter, which is typically approximately one half of the supply voltage. The selection and timing of the various voltage levels to be applied as input voltages to circuit 100 is performed in any convenient manner, including but not limited to table lookup, state machine operation, dedicated logic circuitry, under control of a microprocessor, or the like. For example, FIG. 1C is a circuit depicting a multiplexor suitable for selecting and applying the appropriate voltages $V_A$, $V_C$, $V_{inp}$, $V_{outp}$, $V_{inn}$, $V_{outn}$, $V_B$, and $V_D$ to switches 111 through 114 of circuit 100 of FIG. 1*a*. As such sequential operations are well known to those of ordinary skill in the art and a wide variety of such sequential operational control is possible, this application does not dwell on the specifics of this sequential operation.

TABLE 1

| $V_A$ | $V_B$ | $V_C$ | $V_D$ | Vinp | Vinn | Voutp – Voutn |
|---|---|---|---|---|---|---|
| 0 | Vref | Vref | 0 | $V_{CM}$ | $V_{CM}$ | $Vout_1$ = –Vref/2 |
| Vref | 0 | 0 | Vref | 0 | Vref | $Vout_2$ = –Vref/2 |
| 0 | Vref | Vref | 0 | Vref | 0 | $Vout_3$ = +Vref/2 |
| Vref | 0 | 0 | Vref | $V_{CM}$ | $V_{CM}$ | $Vout_4$ = +Vref/2 |

TABLE 2

(in volts)

| $V_A$ | $V_B$ | $V_C$ | $V_D$ | Vinp | Vinn | Voutp – Voutn |
|---|---|---|---|---|---|---|
| 0 | 5 | 5 | 0 | $V_{CM}$ | $V_{CM}$ | $Vout_1$ = –2.5 |
| 5 | 0 | 0 | 5 | 0 | 5 | $Vout_2$ = –2.5 |
| 0 | 5 | 5 | 0 | 5 | 0 | $Vout_3$ = +2.5 |
| 5 | 0 | 0 | 5 | $V_{CM}$ | $V_{CM}$ | $Vout_4$ = +2.5 |

Figure 2:
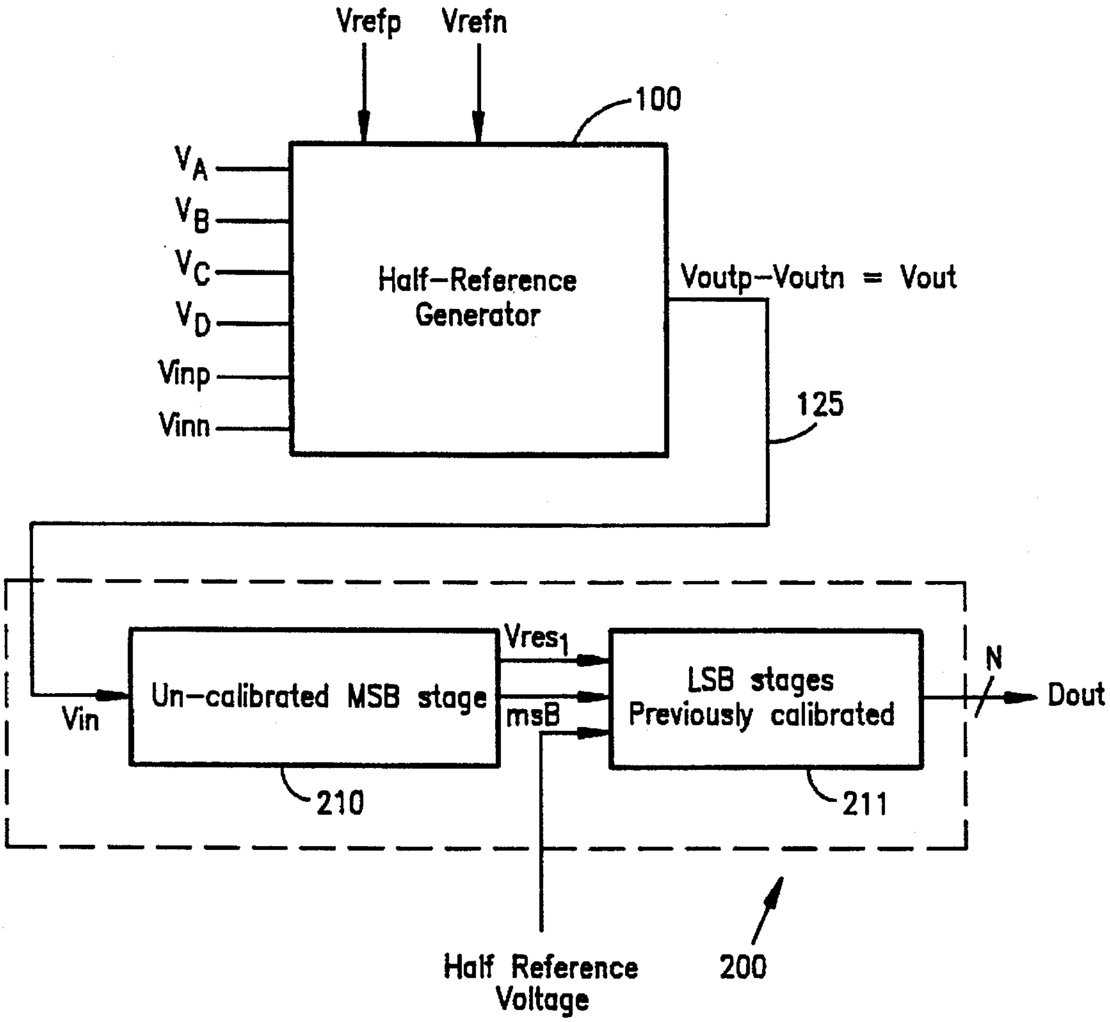
FIG. 2 is a block diagram depicting the half-reference generator of FIG. 1 shown in combination with an analog-to-digital converter stage for providing calibration using the half-reference voltage generator circuit.

The above values are applied sequentially to the input of a pipelined analog to digital converter (ADC) 200, as depicted in the exemplary block diagram of FIG. 2. The common mode voltage $V_{CM}$ is cancelled due to the fact that the analog-to-digital converter is fully differential. Such pipelined ADCs are well known in the art, although a particularly accurate ADC is disclosed in copending U.S. patent application Ser. No. 08/183,679 and assigned to National Semiconductor Corporation (Docket Number NS-2265), and which receives a highly accurate half-reference voltage ±Vref/2 in order to perform second order voltage coefficient calibration or, as is provided by the present invention, an average of $Vout_1$ and $Vout_2$ which average is a highly accurate –Vref/2, and an average of $Vout_3$ and $Vout_4$, which average is a highly accurate +Vref/2. As shown in FIG. 2, half-reference generator 100 applies via lead 125 a value Voutp-Voutn as an input voltage to ADC 200. ADC 200 is shown having an uncalibrated most significant bit (MSB) stage 210, and a plurality of previously calibrated LSB stages 211. These LSB stages 211 are calibrated sequentially using +Vref/2 and –Vref/2 as their input voltages, for example to calibrate a desired number of LSB stages 211, such as is described in the aforementioned copending U.S. patent application Ser. No. 08/183,679. As a result of the ADC operation performed by ADC 200, the uncalibrated MSB stage provides a most significant bit and a residual voltage $Vres_1$ to the LSB stages 211, which in turn provide a plurality of digital bits which, when combined with the digital bit provided by MSB stage 210, provides an n bit digital output word Dout providing a digital representation of the analog input voltage Vin. For each value of Voutp-Voutn, an analog to digital conversion is performed. Ideally, for a 16 bit ADC using a reference voltage of 5 volts, Dout=output(–*Vref*/2) for Vin=–*Vref*/2 and thus

Dout=16384 for Vin =–2.5 volts and ADC=16 bits (5)

where output(Vin) is the digital representation provided for an input voltage Vin to ADC 200.

Dout=output(+*Vref*/2) for Vin=–Vref/2 and thus $$Dout=49152 \text{ for } Vin=+2.5 \text{ and } ADC=16 \text{ bits} \quad (6)$$

However, $E_1$ and $E_2$ are second order errors within the analog-to-digital converter caused by the capacitor voltage coefficient.

For each value of Vout=Voutp−Voutn, its digital representation Dout is the combination of a base (output(−Vref/2) and output(+Vref/2), or 16384 and 49152, respectively, when Vref=5 volts and ADC 200 is a 16 bit ADC, by way of example), the voltage coefficient error for MSB stage 210 ($E_1$ and $E_2$) and errors $A_1$, $A_2$, $A_3$, and $A_4$ due to all non-ideal effects of the half-reference voltage circuit of FIG. 1*a*. Thus, in the general case and for an ADC of 16 bits, respectively:

$$Dout_1=output(-Vref/2)+E_1+A_1 \text{ for } Vin=-Vref/2$$

$$Dout_1=16384+E_1+A_1 \text{ for } Vin=-2.5 \quad (7)$$

$$Dout_2=output(-Vref/2)+E_1+A_2 \text{ for } Vin=-Vref/2$$

$$Dout_2=16384+E_1+A_2 \text{ for } Vin=-2.5 \quad (8)$$

$$Dout_3=output(+Vref/2)+E_2+A_3 \text{ for } Vin=+Vref/2$$

$$Dout_3=49152+E_2+A_3 \text{ for } Vin=+2.5 \quad (9)$$

$$Dout_4=output(+Vref/2)+E_2+A_4 \text{ for } Vin=+Vref/2$$

$$Dout_4=49152+E_2+A_4 \text{ for } Vin=+2.5 \quad (10)$$

Combining equations (1) and (2) with the non-ideal effects of MSB stage 210 and ideal LSB stages 211 yields, for a specific example having a 10 ppm capacitor voltage coefficient and 0.1% capacitor mismatches:

$Dout_1$=16353.4 LSB units (for Vin=−2.5 volts)

$Dout_2$=16418.57 LSB units (for Vin=−2.5 volts)

$Dout_3$=49117.5 LSB units (for Vin=+2.5 volts)

$Dout_4$=49182.6 LSB units (for Vin=+2.5 volts).

Figure 3:
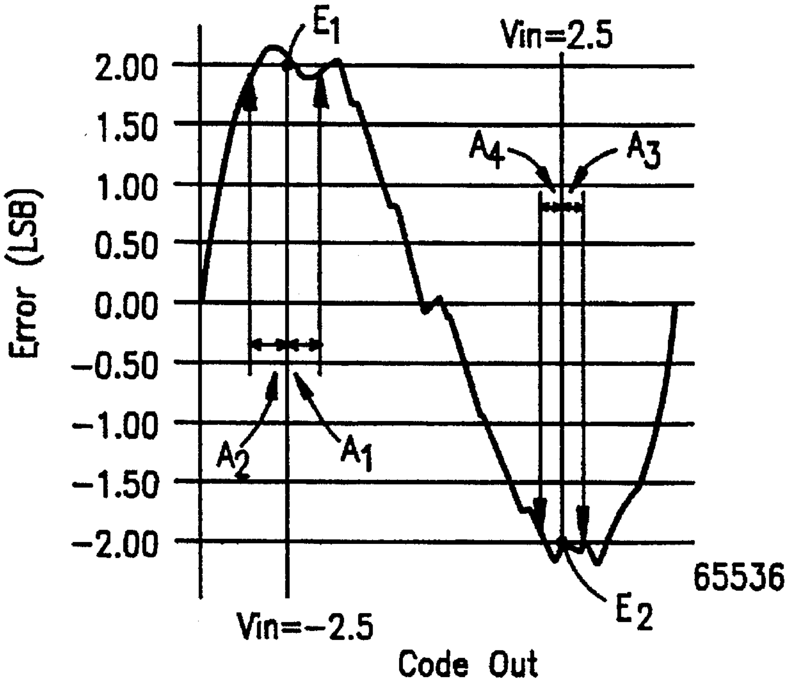
FIG. 3 is a graph depicting the linearity of an analog-to-digital converter without the second order coefficient calibration, but after correction for gain and offset errors.

The values of Vin=−Vref/2 and Vin=+Vref/2 used for calibration are symmetrical about their ideal values of Vin=±Vref/2, as shown in FIG. 3 for the specific example where Vref=5 volts.

Independent of capacitor mismatch, operational amplifier gain, charge injection, and voltage coefficient, the values of $E_1$ and $E_2$ can be isolated from all other non-ideal effects by averaging the two measurements taken for each value of Dout corresponding to ±Vref/2, respectively:

$$E_1 = \frac{Dout_1 + Dout_2}{2} - output(Vref/2) \quad (11)$$

$$E_2 = \frac{Dout_3 + Dout_4}{2} + output(Vref/2) \quad (12)$$

Figure 4:
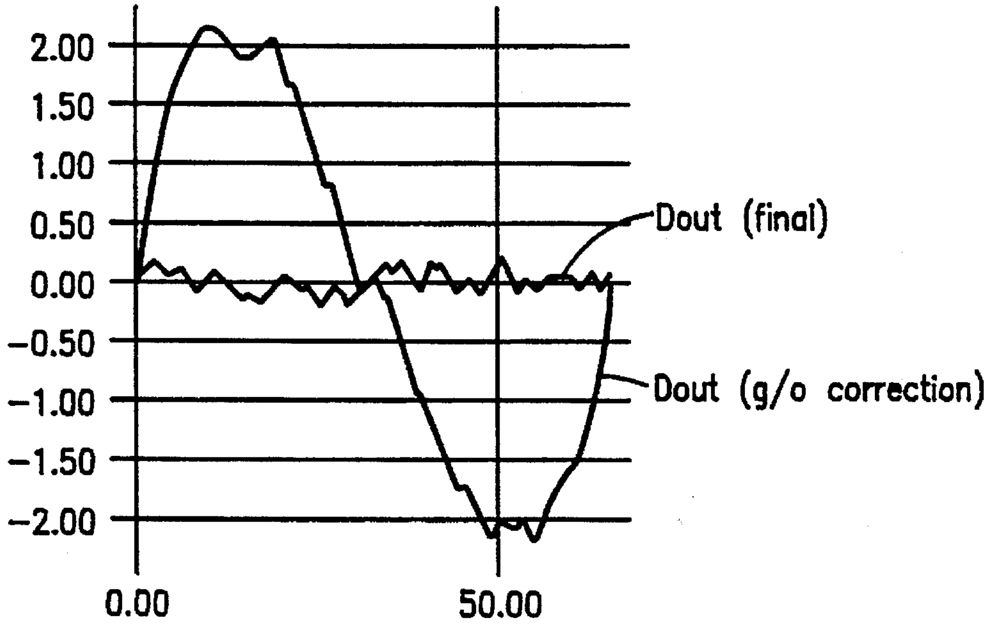
FIG. 4 is a graph depicting the improvement in analog to digital converter accuracy as a result of the second order calibration feature achieved using the highly acccurate ratioed reference voltage provided by the present invention.

Therefore, solving equations (11) and (12) for the specific examples of $Dout_1$ through $Dout_4$ given above yields $E_1$=+2LSB, and $E_2$=−2LSB as seen from FIG. 3. This result is equivalent to a single measurement taken with ideal values of ±Vref/2. Applying $E_1$ and $E_2$ to the circuit of FIG. 2 results in an 18-bit accurate 16 bit ADC, as described more fully in the aforementioned copending U.S. patent application. FIG. 4 is a graph depicting a first curve Dout(g/o correction) showing a rather significant second order voltage coefficient existing after gain and offset calibration as taught by the aforementioned copending application, but prior to second order calibration. The second curve Dout(final) of FIG. 4 shows the much improved second order voltage coefficient resulting from second order calibration achieved using the highly accurate ratioed reference voltages as provided by this invention.

All publications and patent applications mentioned in his specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. An n-bit analog-to-digital converter (ADC) system, where n is a positive integer, the ADC system comprising:

(a) a ratioed reference voltage generator that uses a reference voltage $V_{ref}$, the reference voltage generator including (i) a voltage selector having a plurality of voltage selector inputs and a plurality of voltage selector outputs for applying a first voltage to a corresponding voltage selector output during a time period $\phi_1$, and for applying a second voltage to a corresponding voltage selector output during a following time period $\phi_2$, wherein the voltage applied to one voltage selector output during any time period is not necessarily the same as the voltage applied to another voltage selector output;

(ii) an amplifier having a plurality of inputs and a differential voltage output; and (iii) a plurality of sets of capacitances, each set of capacitances coupling an associated one of the voltage selector outputs to an associated one of the inputs of the amplifier and having a value such that the electrical combination of the voltages and capacitances provides a voltage level of $\pm V_{ref}/m$, where m is any desired number, at the differential output of the amplifier;

(b) an n-bit analog-to-digital converter including (i) an MSB stage, connected to receive the ratioed reference voltage $\pm V_{ref}/m$ from the ratioed reference voltage generator, for generating the most significant bit of the digital representation of the analog $\pm V_{ref}/m$ voltage and a residual voltage output; and (ii) n-1 LSB stages coupled in cascade with the MSB stage, wherein each LSB stage is connected to receive a residual voltage input from the previous LSB stage to generate a non-MSB bit corresponding with the position of the LSB stage and a residual voltage output, wherein the combination of the MSB and the n-1 LSB bits corresponds to a raw digital representation of the analog $\pm V_{ref}/m$ voltage; and (c) digital circuitry for processing the raw digital representation of the analog $\pm V_{ref}/m$ and providing a final digital representation of the analog $\pm V_{ref}/m$ after modifying the raw digital representation to adjust for errors in the gain and inherent offsets of the MSB stage and the n-1 LSB stages.

2. An n-bit analog-to-digital converter system as in claim 1 wherein the voltage selector comprises a multiplexor.

3. An n-bit analog-to-digital converter system as in claim 1 wherein m is 2.

4. An n-bit analog-to-digital converter system as in claim 1 wherein the preselected voltage level applied to the corresponding voltage selector output is selected from the group comprising $V_{ref}$, 0, and $V_{CM}$, where $V_{CM}$ is a common-mode voltage.

5. An n-bit analog-to-digital converter system as in claim 1 wherein:

the amplifier includes a first amplifier input and a second amplifier input;

the voltage selector includes eight voltage selector inputs and four voltage selector outputs, wherein four of the voltage selector inputs correspond to the first amplifier input via two voltage selector outputs and the other four voltage selector inputs correspond to the second amplifier input via the other two voltage selector outputs, with each voltage selector output corresponding to a pair of voltage selector inputs; and wherein the capacitance at each voltage selector output is coupled in series between the voltage selector output and its associated one of the first and second amplifier inputs.

6. A ratioed reference voltage circuit as in claim 1 wherein said amplifier includes a differential output and said voltage level of $\pm V_{ref}/m$ is realized across said differential output.

7. A method of generating an accurate ratioed reference voltage $\pm V_{ref}/m$, where m is any desired number, from a reference voltage $V_{ref}$, the method comprising the steps:

applying a first set S1 of input reference voltages to a first input to an amplifier and second set S2 of input reference voltages to a second input to the amplifier during a time period $\phi_1$;

applying a third set of S3 of input reference voltages to the first input to the amplifier and fourth set S4 of input reference voltages to the second input to the amplifier during a time period $\phi_2$;

maintaining the voltage levels at the first input and second input of the amplifier until a new set of input reference voltages is applied to the first input and second input of the amplifier; and synthesizing the voltages at the first input and the second output such that a differential output of the amplifier provides a ratioed reference voltage $\pm V_{ref}/m$.

8. A method of generating an accurate ratioed reference voltage $\pm V_{ref}/m$ as in claim 7 further comprising the step:

providing the ratioed reference voltage $\pm V_{ref}/m$ to an n-bit analog-to-digital converter calibration assembly.

9. A method of generating an accurate ratioed reference voltage $\pm V_{ref}/m$ as in claim 7 wherein the step of holding the voltages at the first input and second input of the amplifier is accomplished with a capacitance placed in series with each input reference voltage when contact between the input reference voltage and the capacitance exists.

10. A method of generating an accurate ratioed reference voltage $\pm V_{ref}/m$ as in claim 7 further comprising the step of:

selecting the combination of input reference voltages at each time period and the capacitances of each capacitor such that the differential output of the amplifier will provide an accurate ratioed reference voltage $\pm V_{ref}/m$ after the inputs to the amplifier are synthesized.

11. A method of calibrating an n-bit analog-to-digital converter comprising the steps:

generating a first ratioed reference voltage $\pm V_{ref}/m$ from $V_{ref}$ during a time period $t_1$;

applying the first ratioed reference voltage $\pm V_{ref}/m$ to an analog signal input of the n-bit analog-to-digital converter;

obtaining a first raw n-bit digital representation of the input analog first ratioed reference voltage $\pm V_{ref}/m$;

generating a second ratioed reference voltage $\pm V_{ref}/m$ from $V_{ref}$ during a following time period $t_2$;

applying the second ratioed reference voltage $\pm V_{ref}/m$ to the analog signal input of the n-bit analog-to-digital converter;

obtaining a second raw n-bit digital representation of the input analog second ratioed reference voltage $\pm V_{ref}/m$; and obtaining a final n-bit digital representation of the analog signal input by processing the first raw n-bit digital representation and the second raw n-bit digital representation.

12. A method of calibrating an n-bit analog-to-digital converter as in claim 11 wherein the steps of generating the first and second ratioed reference voltage $\pm V_{ref}/m$ further comprises the steps:

applying a set S1 of input reference voltages to a first input to an amplifier and another set S2 of input reference voltages to a second input to the amplifier during a time period $\phi_1$;

applying a set S3 of input reference voltages to the first input to the amplifier and another set S4 of input reference voltages to the second input to the amplifier during a time period $\phi_2$;

holding the voltage levels at the first input and second input of the amplifier until a new set of input reference voltages is applied to the first input and second input of the amplifier; and synthesizing the voltages at the first input and the second output such that a differential output of the amplifier provides a ratioed reference voltage $\pm V_{ref}/m$.

13. A method of calibrating an n-bit analog-to-digital converter as in claim 11 wherein the step of obtaining the final n-bit digital representation of the analog input is accomplished by averaging the first raw n-bit digital representation and the second raw n-bit digital representation.

14. A method of calibrating an n-bit analog-to-digital converter as in claim 11 wherein the step of obtaining the final n-bit digital representation of the analog input is accomplished by modifying the first raw digital representation and the second raw digital representation to adjust for errors in the gain and inherent offsets in the n-bit analog-to-digital converter.

* * * * *